(12) United States Patent
Chen et al.

(10) Patent No.: US 7,142,436 B1
(45) Date of Patent: Nov. 28, 2006

(54) RELIABLE BI-DIRECTIONAL DRIVING CIRCUIT FOR WIDE SUPPLY VOLTAGE AND OUTPUT RANGE

(75) Inventors: Tsz-Lang Chen, Chung-Ho (TW); Ben-Mou Yu, Chung-Ho (TW)

(73) Assignee: Wise Life Technology Co., Ltd. (TW)

( * ) Notice: Subject to any disclaimer, the term of this patent is extended or adjusted under 35 U.S.C. 154(b) by 0 days.

(21) Appl. No.: 11/338,962

(22) Filed: Jan. 25, 2006

(51) Int. Cl.
*H02M 3/335* (2006.01)
*H02M 5/42* (2006.01)

(52) U.S. Cl. .......................... 363/17; 363/98; 318/439

(58) Field of Classification Search ............... 363/17, 363/98, 132; 318/439, 254
See application file for complete search history.

(56) References Cited

U.S. PATENT DOCUMENTS

| | | | |
|---|---|---|---|
| 4,528,514 A * | 7/1985 | Quackenbush | 330/146 |
| 4,939,633 A * | 7/1990 | Rhodes et al. | 363/98 |
| 5,654,880 A * | 8/1997 | Brkovic et al. | 363/17 |
| 6,229,273 B1 * | 5/2001 | Kelly et al. | 318/254 |
| 6,385,067 B1 * | 5/2002 | Galbiati et al. | 363/132 |
| 6,741,483 B1 * | 5/2004 | Stanley | 363/65 |
| 6,943,514 B1 * | 9/2005 | Chen et al. | 318/439 |
| 6,977,533 B1 * | 12/2005 | Kernhof et al. | 327/110 |
| 7,072,199 B1 * | 7/2006 | Chen et al. | 363/132 |

* cited by examiner

*Primary Examiner*—Bao Q. Vu

(57) ABSTRACT

A bi-directionally load current driving circuit is disclosed. The bi-directionally load current driving circuit comprises a voltage source; a bridge circuit comprising a first switch, a second switch, a third switch, a fourth switch, a first output terminal, and a second output terminal, wherein said first output terminal and said second output terminal are connected to a load; a first power controller comprising a first input terminal, a second input terminal, and an output terminal electrically connected to an input terminal of said first switch; a second power controller comprising a first input terminal, a second input terminal, and an output terminal electrically connected to an input terminal of said second switch; a third power controller comprising a first input terminal, a second input terminal, and an output terminal electrically connected to an input terminal of said third switch; a fourth power controller comprising a first input terminal, a second input terminal, and an output terminal electrically connected to an input terminal of said fourth switch; a plurality of feedback networks comprising a control voltage in which said plurality of feedback networks connected to said first power controller, said second power controller, said third power controller, and said fourth power controller such that a current flowing through the load is proportional to said control voltage.

33 Claims, 14 Drawing Sheets

RELIABLE BI-DIRECTIONAL DRIVING CIRCUIT FOR WIDE SUPPLY VOLTAGE AND OUTPUT RANGE

BACKGROUND OF THE PRESENT INVENTION

1. Field of Invention

This invention relates to a bi-directionally current driving circuit, and more particularly to a bi-directionally current driving circuit utilizing a H-bridge configuration, which uses a single power source.

2. Description of Related Arts

For a load element driven by a bi-directionally current driving circuit such as a DC motor, a thermal electric cooler . . . etc, the direction of the current flow will change its physics characteristics. For example, if the current flows from a positive terminal of a DC motor to a negative terminal of the DC motor, the motor rotates clockwise; on the contrary, if the current flows from the negative terminal of the DC motor to the positive terminal of the DC motor, then the motor rotates counterclockwise. Another example is a thermal electric cooler; if the current flows from a positive terminal of the thermal electric cooler to a negative terminal of the thermal electric cooler, then one surface of the thermal electric cooler represents a hot contact surface and the other surface of the thermal electric cooler represents a cold contact surface. If the current direction is reversed, the hot contact surface and cold contact surface will be exchanged too. Therefore, there must be bi-directionally current driving circuits to be developed for these bi-directional applications.

Traditionally, the bi-directionally current driving circuits can be categorized into the following two groups:

Dual Power Supplies Mode

As shown in FIG. 1, a positive power supply Vcc is connected to the collector of an NPN power transistor 101, and a negative power supply $V_{EE}$ is connected to the collector of another PNP power transistor 102. A load element 103 is connected to the emitters of the NPN power transistor 101 and the PNP power transistor 102. The other end of the load element is connected to ground.

A controller 104 drives the NPN power transistor 101 and the PNP transistor 102 based on its input, and then the NPN power transistor 101 and the PNP power transistor 102 provide the needed power to the load element 103. The current direction flowing through the load element 103 depends on the input of the controller 104, which can be either supplied by the positive power source Vcc to the load element 103, or by the negative power source $V_{EE}$ to the load element 103. The mode has the following drawbacks:

1. The mode needs 2 independent voltage sources (positive power source Vcc and negative source $V_{EE}$) to provide the needed current polarity changes for the load element 103.

2. Power utilization rate is low; the maximum voltage of the load element 103 swings $V_{RL,Max}=\pm(Vi-V_{be})$. The $V_{be}$ for a current power transistor is approximately 0.7 V, which is not an ideal solution for low voltage operations.

H-Bridge with Single Power Supply Mode

The mode consists of four power transistors and a load element, whose geometrical shape is like the capital 'H'; therefore it is called H-bridge. Based on the configurations of the transistors connection, the mode can be divided into the MOSFET (Metal Oxide Semiconductor Field-Effect Transistor) configuration as shown in FIG. 2 and the BJT (Bipolar Junction Transistor) configuration as shown in FIG. 3. In FIG. 2 or 3, the load elements 205 and 305 are respectively connected to the source terminals of four MOSFETs and the emitter terminals of four BJTs. Its drawback is the low power utilization: the maximum swing in voltage $V_{RL,Max}=\pm(Vi-2\ V_{GS})$ or $V_{RL,Max}=\pm(Vi-2\ V_{be})$, where $V_{GS}$ and $V_{be}$ are the voltage drops across the gate terminal and the source terminal of the MOSFET or the base terminal and the emitter terminal of the BJT.

The H-bridge circuit can be modified to the MOSFET structure (or the BJT structure) as shown in FIG. 4, where the load element is connected to the drain terminals of four MOSFETs 401, 402, 403 and 404, or the collector terminals of four BJTs. With the configuration, the maximum voltage swinging at the terminal of the load element can reach the ideal $V_{RL,Max}=Vcc$, but the gates and the bases of the four transistors 401, 402, 403 and 404 must be controlled individually. The prior arts still have the following drawbacks:

1. Because the DC control voltages on the individual gates of transistors 401, 402, 403 and 404 are different, they cannot be connected to the gates or bases directly as shown in FIG. 2 or FIG. 3; therefore, the control circuits must be designed individually, which are relatively complicated.

2. If not appropriately designed, the control circuit could possibly produce the currents in vertical direction Iver1 and Iver2. The current originates from power source Vcc, flows through the MOSFETs 401, 402 (or 403, 404), and then arrives to ground. Because the powers are applied to the MOSFETs 401, 402 (or 403, 404) directly, these transistors are easily damaged.

SUMMARY OF THE PRESENT INVENTION

It is therefore an object of the present invention to solve the foregoing problems in the conventional technology.

A main object of the present invention is to provide a bi-directionally load current driving circuit, whereby the current flowing through a load is unrelated to the supply voltage; instead, it is proportional to the control voltage.

Another object of the present invention is to provide a bi-directionally load current driving circuit, whereby the voltage is evenly distributed on the diagonal transistors on the H-bridge, i.e. the power consumption can be evenly distributed on the diagonal transistors.

Another object of the present invention is to provide a bi-directionally load current driving circuit, whereby no current is produced on the two vertical branches of the H-bridge circuit.

Another object of the present invention is to provide a bi-directionally load current driving circuit, whereby the circuit structure is symmetrical and the circuit has the characteristics of low drift voltage.

Another object of the present invention is to provide a bi-directionally load current driving circuit, whereby the circuit can be operated under a low voltage.

Another object of the present invention is to provide a bi-directionally load current driving circuit, whereby the circuit employs only one single power supply and simple circuit that needs only about a dozen of transistors, which makes the entire circuit design to be fabricated into an IC chip easily.

Accordingly, in order to accomplish the one or some or all above objects, the present invention provides a bi-directionally load current driving circuit comprising:

a voltage source;

a bridge circuit comprising a first switch, a second switch, a third switch, and a fourth switch, wherein the voltage source provides a power supply to the first switch, the second switch, the third switch and the fourth switch, which are electrically connected to form two arms, the two arms has a first output terminal and a second output terminal individually, and the first output terminal and the second output terminal are connected to a load;

a first differential amplifier comprising a first input terminal, a second input terminal, and an output terminal electrically connected to an input terminal of the first switch;

a second differential amplifier comprising: a first input terminal, a second input terminal, and an output terminal electrically connected to an input terminal of the second switch;

a third differential amplifier comprising a first input terminal, a second input terminal, and an output terminal electrically connected to an input terminal of the third switch;

a fourth differential amplifier comprising a first input terminal, a second input terminal, and an output terminal electrically connected to an input terminal of the fourth switch;

a first feedback network connected to the first input terminal of the first differential amplifier and the first input terminal of the second differential amplifier;

a second feedback network comprising a control voltage connected to the second feedback network, which is connected to the second input terminal of the first differential amplifier, the second input terminal of the second differential amplifier, and the first output terminal of the bridge circuit;

a third feedback network connected to the first input terminal of the third differential amplifier, the first input terminal of the fourth differential amplifier, and the first output terminal and the second output terminal of the bridge circuit; and a fourth feedback network connected to the second input terminal of the third differential amplifier and the second input terminal of the fourth differential amplifier;

wherein a current flowing through the load is unrelated to the power supply; instead, the current is proportional to the control voltage.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

DETAILED DESCRIPTION OF THE PREFERRED EMBODIMENT

Figure 1:
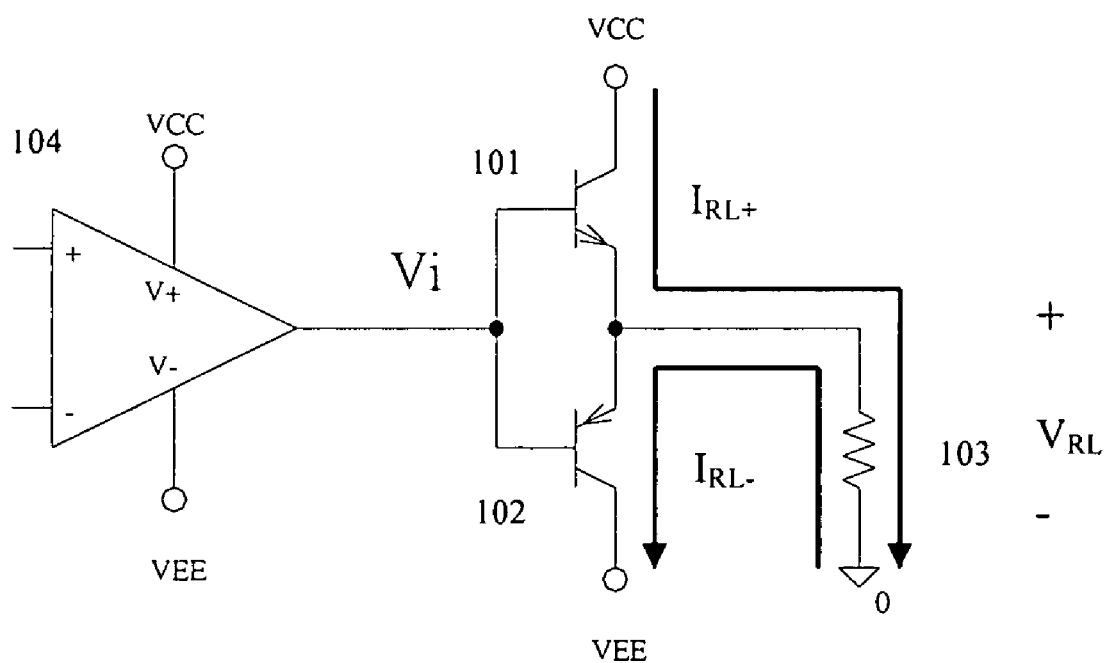
FIG. 1 is the circuit diagram of a traditional bi-directionally load current driving circuit.
Figure 2:
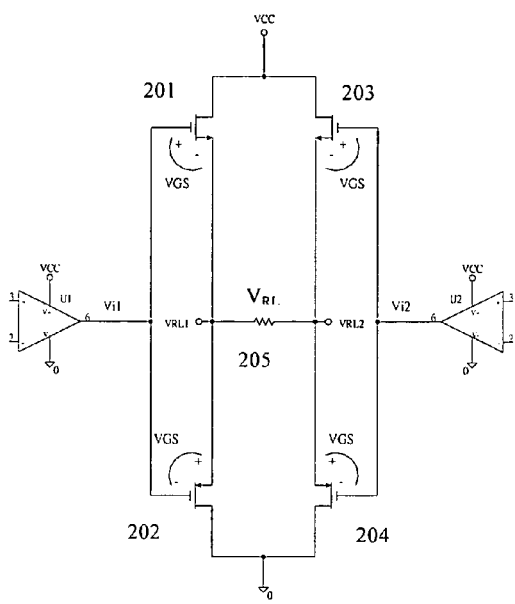
FIG. 2 is the circuit diagram of a traditional bi-directionally load current driving circuit that uses the H-bridge circuit of MOSFET power transistors.
Figure 3:
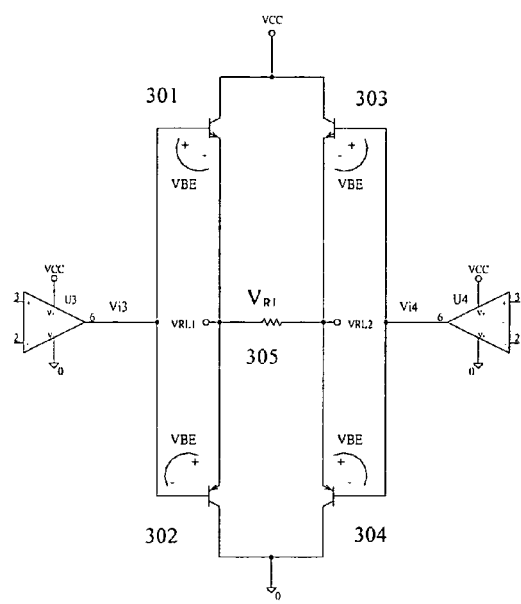
FIG. 3 is the circuit diagram of a traditional bi-directionally load current driving circuit that uses the H-bridge circuit of BJT power transistors.
Figure 4:
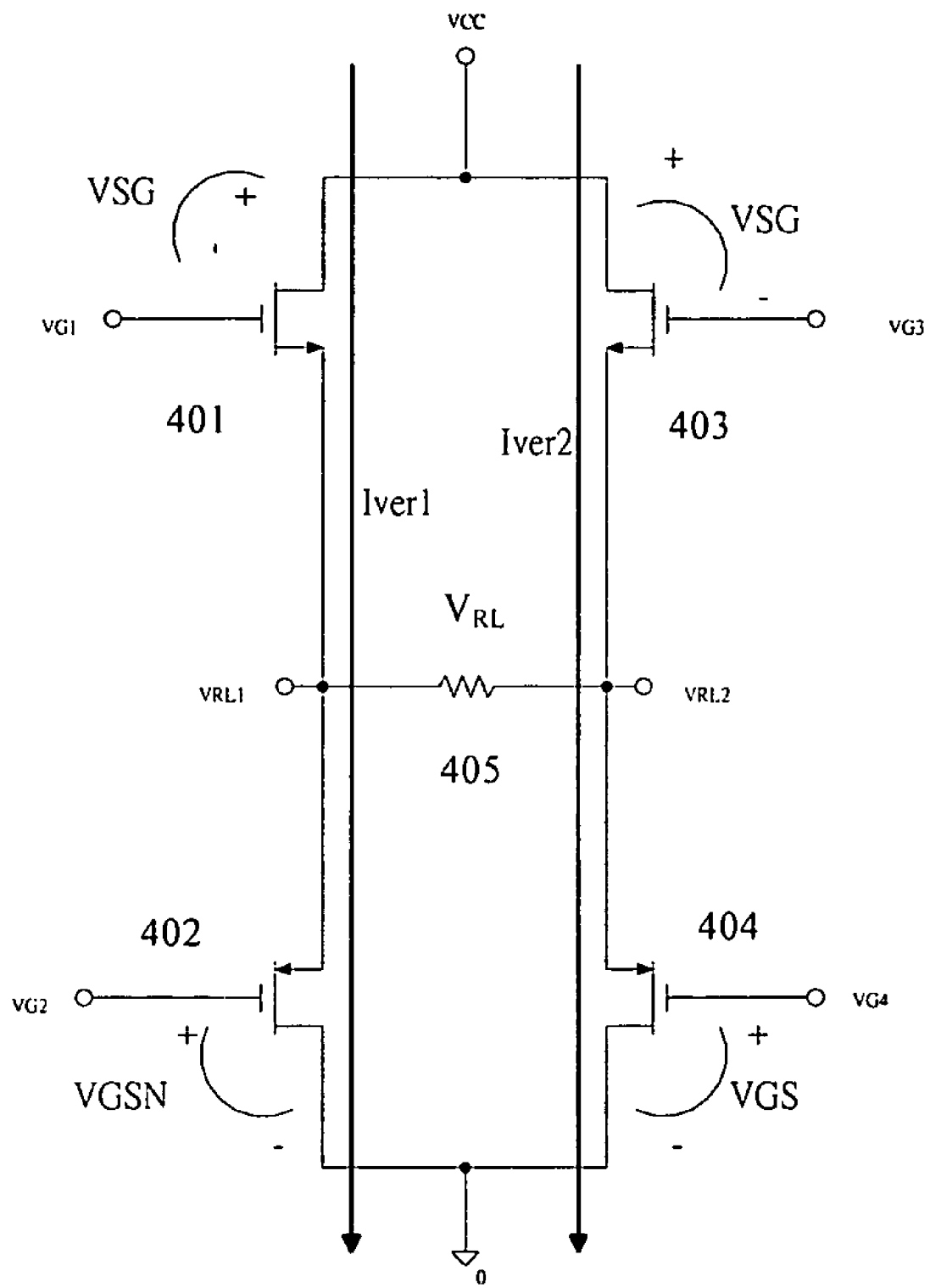
FIG. 4 is the circuit diagram of another traditional bi-directionally load current driving circuit that uses only one power supply in the H-bridge circuit.
Figure 5:
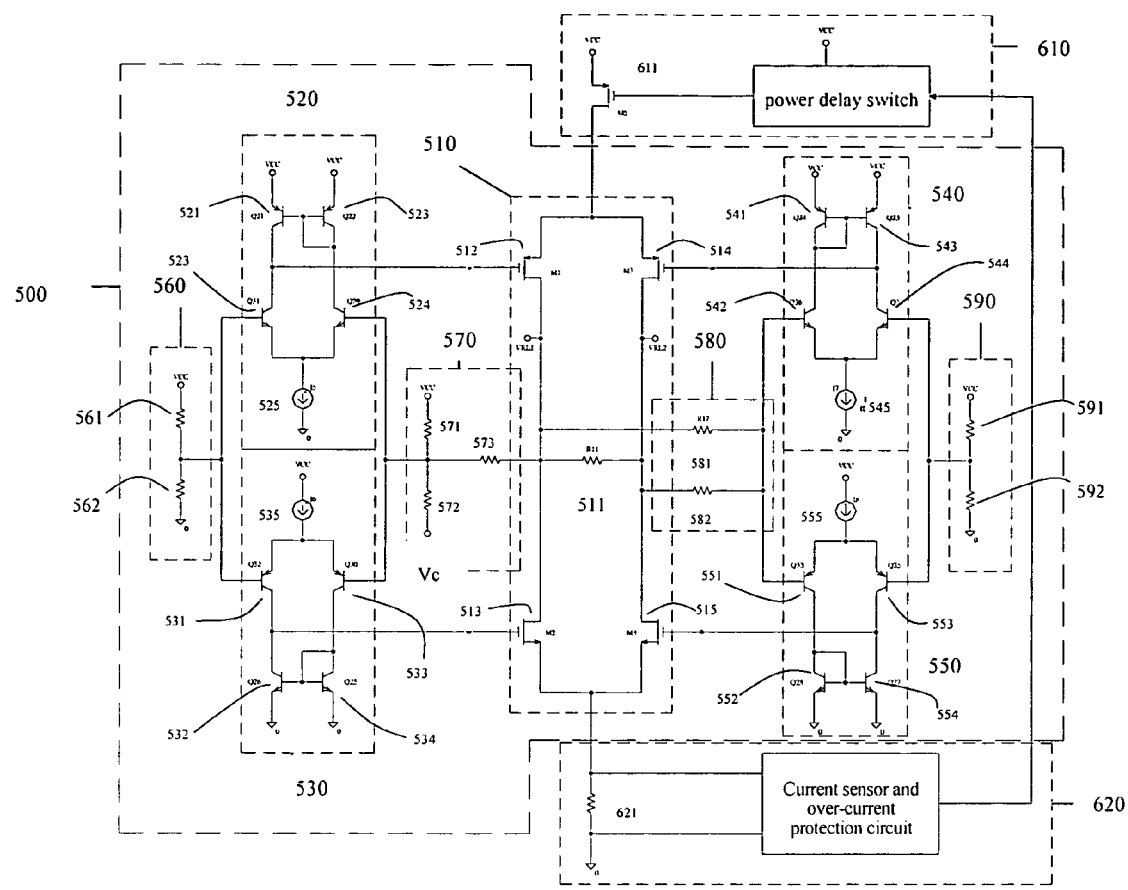
FIG. 5 is the circuit diagram of the bi-directionally load current driving circuit according to a first preferred embodiment of the present invention.

Referring to FIG. 5, the circuit diagram of the bi-directionally load current driving circuit according to a first preferred embodiment of the present invention is illustrated. As shown in FIG. 5, the driving circuit mainly comprises a main circuit structure 500 and two 2 auxiliary circuits 610 and 620.

The main circuit structure 500 comprises a H-bridge circuit 510, four power controllers 520, 530, 540 and 550, four feedback networks 560, 570, 580 and 590, and a control voltage Vc. A load 511 crosses between the two arms of the H-bridge circuit 510. The current passing through these transistors 512, 513, 514 and 515, which depends on conduction statuses of transistors 512, 513, 514 and 515. In addition, these transistors 512, 513, 514 and 515 are controlled by four power controllers 520, 530, 540 and 550 respectively.

Each of the four power controllers 520, 530, 540 and 550 is made of four transistors and a current source, and hence creates a differential amplifier. The power controller 520 is made of four transistors 521, 522, 523 and 524, and a current source 525. The power controller 530 is made of four transistors 531, 532, 533 and 534, and a current source 535. The power controller 540 is made of four transistors 541, 542, 543 and 544, and a current source 545. The power controller 550 is made of four transistors 551, 552, 553 and 554, and a current source 555. Each of the four output terminals G1, G2, G3 and G4 from the four power controllers 520, 530, 540 and 550 is connected to the gate of the corresponding transistors 521, 522, 523 and 524, and their input terminals are connected to feedback networks 560, 570, 580 and 590 respectively. The input terminal of the power controller 520 and the input terminal of the power controller 530 are connected in parallel, and their output terminals are connected to the transistor 512 and the transistor 513 to form a push-pull amplifier circuit. Similarly, the power controller 540 and the power controller 550 also form a vertically symmetrical push-pull amplifier circuit on right side with the transistor 514 and the transistor 515 respectively.

The auxiliary circuit structures 610, and 620 are a current sensor and over-current protection circuit 620, and a power delay switch 610 respectively. The current sensor and over-current protection circuit work as follows: when the current flows through the H-bridge circuit 510 and through a resistor 621 to obtain a voltage drop that is fed to the power delay switch 610, which will limit the power transistor 611 within a pre-determined maximum current for the load to protect the circuit. Another important purpose for the power delay switch 610 is, by delaying supplying the power into the H-bridge circuit 510, to make the control circuits of the power controllers 520, 530, 540 and 550 to enter a steady state, and thus to force the initial current values in all power transistors 512, 513, 514 and 515 on the H-bridge circuit 510 are all zero until the preset delay time is past. The entire feedback control system can obtain the following results in FIG. 5:
 1. There is no current flowing through the 2 vertical braches on the H-bridge circuit.
 2. The current flowing through the load $$|I_{RL}| = |2V_C/R_L|$$

is constant to supply voltage Vcc; instead, it is proportional to the control voltage Vc.
 3. The voltage is evenly distributed on the diagonal transistors 512 and 515, or 513 and 514, i.e. the power consumption is evenly distributed on the diagonal lines.
 4. The symmetrical Gain Block structure can easily drive the output stage in range of rail-to-rail, i.e. from 0V to Vcc.
 5. The circuit structure is symmetrical and low drift in voltage.
 6. The circuit structure can be operated under as low as 3V.
 7. The circuit structure needs only a dozen of transistors, which can be fabricated in an IC chip easily.
 8. Only single power supply is required.

Figure 6:
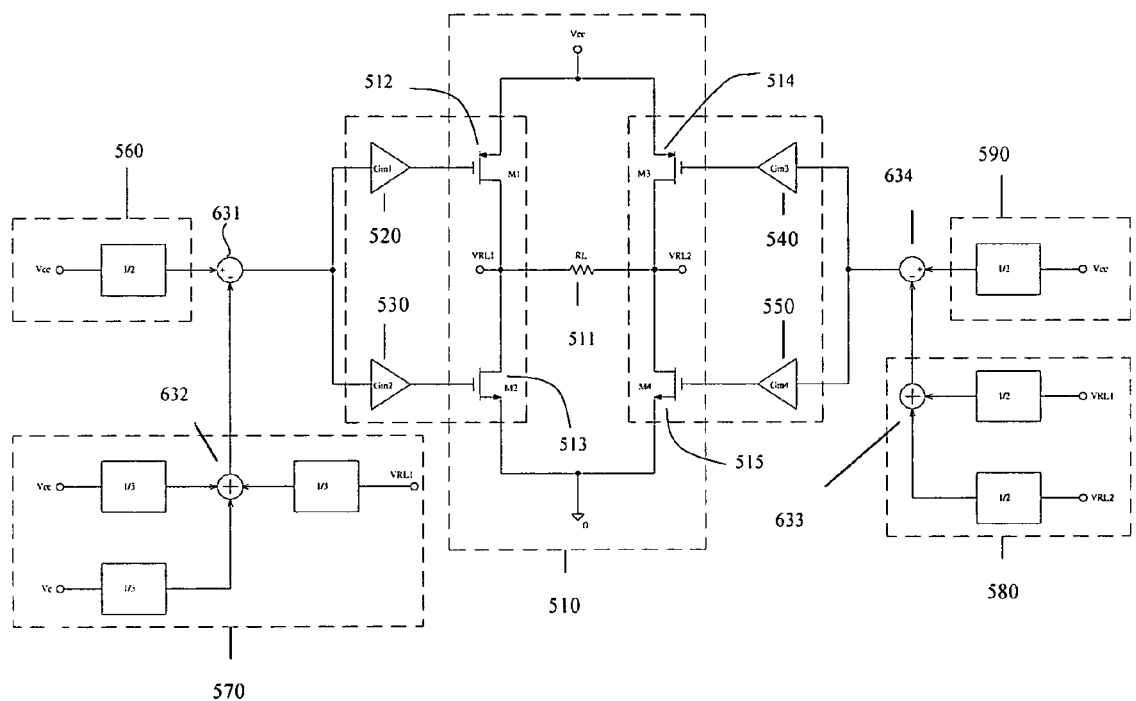
FIG. 6 is the simplified circuit diagram of FIG. 5.
Figure 7:
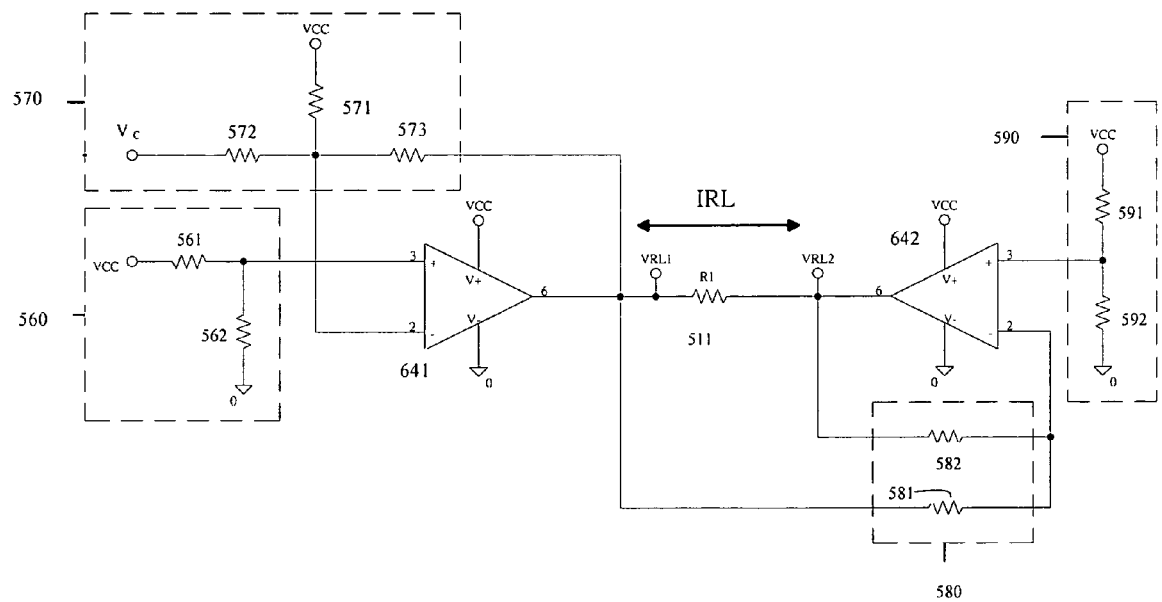
FIG. 7 is another simplified circuit diagram of FIG. 5.

FIG. 6 is the simplified circuit diagram of FIG. 5. As shown in FIG. 5, the feedback circuit 560 comprises two resistors 561 and 562, whose resistance is 2R. Therefore, a half of the supply voltage ½ Vcc is fed to the positive terminal of a joint node 631 as shown in FIG. 6, and the resistors 571, 572, 573 of the feedback circuit 570 in FIG. 5. After a third of the supply voltage Vcc/3, a third of control voltage Vc/3 and a third of load voltage $V_{RL1}/3$ are summed in the joint node 632, which is then fed into the negative terminal of the joint node 631 as shown in FIG. 6. As shown in FIG. 5, the resistance of resistors 591, 592 of feedback circuit 590 is 2R. A half of the power supply voltage ½ Vcc is fed into the positive terminal of a joint node 634 as shown in FIG. 6. The resistance of resistors 581, 582 of the feedback circuit 580 as shown in FIG. 5 is 2R. The voltages on the two terminals between the load $V_{RL1}/2$ and $V_{RL2}/2$ are summed on the joint node 633 as shown in FIG. 6, which is then fed to the negative terminal of joint node 634 as shown in FIG. 6. The entire effects can be demonstrated again on the simplified circuit diagram as shown in FIG. 7 clearly, where 641 consists of the power controllers 520, 530, the transistors 512, 513 as shown in FIG. 5; and where 642 consists of the power controllers 540, 550, the transistors 514, 515 as shown in FIG. 5. FIG. 7 clearly shows that the main circuit structure 500 is the bridge amplifier with single power supply, whose close loop load current can be calculated as follows.

The equation for the close loop current function is as below:

$$V_{CC}/2 = V_{CC}/3 + V_C/3 + V_{RL1}/3 \quad (1)$$

$$V_{CC}/2 = V_{RL1}/2 + V_{RL2}/2 \quad (2)$$

From the equations (1), (2), we can get the voltages on both sides of the load element are:

$$V_{RL1} = V_{CC}/2 - V_C \quad (3)$$

$$V_{RL2} = V_{CC}/2 + V_C \quad (4)$$

And the current flowing through $R_L$ is:

$$I_{RL} = (V_{RL1} - V_{RL2})/R_L = -2V_C/R_L \quad (5)$$

From the equation (5), it is clearly known that the load current in a close loop circuit is constant to the power supply voltage, but is proportional to the control voltage Vc. Furthermore, from the equations (3), (4), it is obvious that the voltages on both sides of the load are symmetrical to a half of the supply voltage Vcc, which guarantees that the current flowing through transistors on a diagonal line 512, 515 is same as the one through transistors 513, 514 on the other diagonal line; meanwhile, the voltage drops are same too. Therefore, it won't occur that the power consumption is concentrated on a certain transistor.

We now explain the individual operation of the MOSFETs 512, 513, 514 and 515 in the H-bridge circuit as following:

The equations for the characteristics of MOSFET can be described as below:

$$I_{SD} = K(V_{GS} - V_T)^2, \ V_{GS} > V_T.$$

$$I_{SD} = 0, \ V_{GS} < V_T$$

$$V_T = 0.6V$$

Where the $I_{SD}$ is the current flowing through the MOSFET, $V_{GS}$ is the voltage drop from gate to source in the MOSFET, and $V_T$ is the threshold voltage of the MOSFET.

Figure 8:
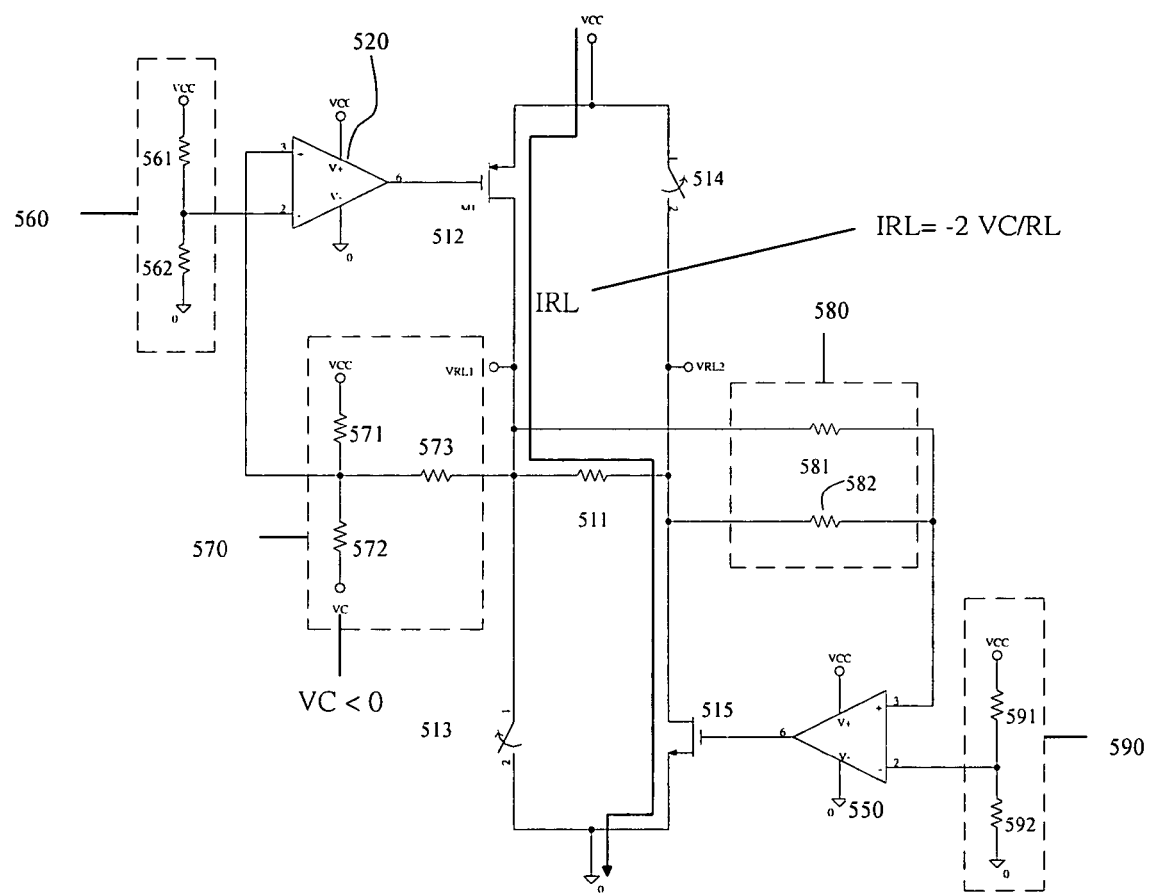
FIG. 8 is the working status diagram of the main H-bridge structure of FIG. 5 when the control voltage Vc<0.

The outputs of the power controllers 520, 530, 540 and 550 can be assumed to be between the power supply voltage or 0V with a very low voltage difference of the BJT's saturation voltage drop, which is approximately 0.2V. When the control voltage Vc<0, the operation status of the H-bridge circuit is shown in FIG. 8. Because the transistors 530 and 540 are saturated, the Vgs is about 0.2V, which is far lower than $V_T$; therefore, 513 and 514 are turned off. On the other hand, 520, 550 and 512, 515 are on the operation range, i.e. $V_{GS} > V_T$, and the load current for the close loop circuit is:

$$I_{RL} = 2V_C/R_L$$

where the definition of current polarity is that the node connected to 514 and 515 is positive, and the node connected to 512 and 513 is negative. If the load current flows from a positive node to a negative node, then it is called positive load current; if reverse, it is called negative load current.

Figure 9:
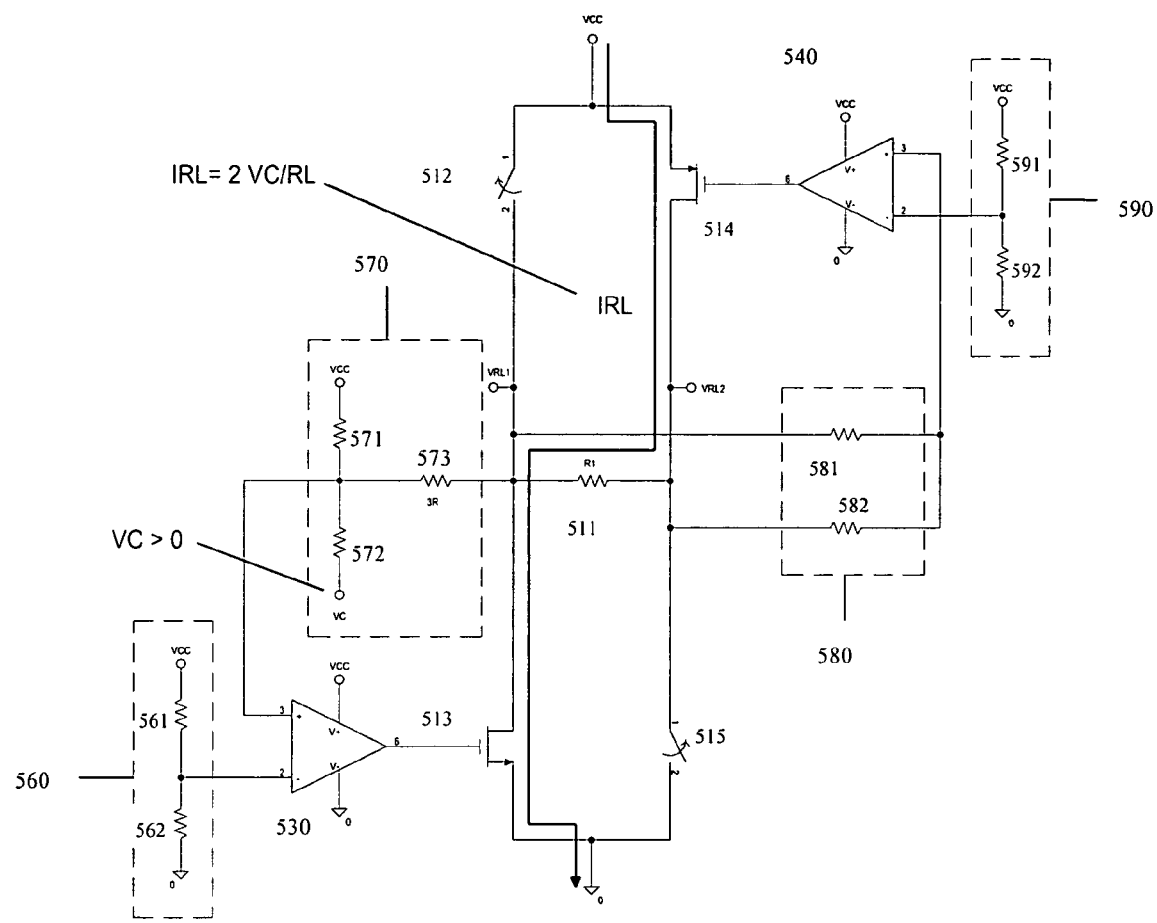
FIG. 9 is the working status diagram of the main H-bridge structure of FIG. 5 when the control voltage Vc>0.

When the control voltage Vc>0, the operation status of the H-bridge circuit is shown in FIG. 9, which is similar to FIG. 8 except 512 and 515 are turned off; while 530, 540 and 513. 514 are on the operation range, i.e. $V_{GS}>V_T$, and the load current for the close loop circuit is:

$$I_{RL}=2V_C/R_L$$

Figure 10:
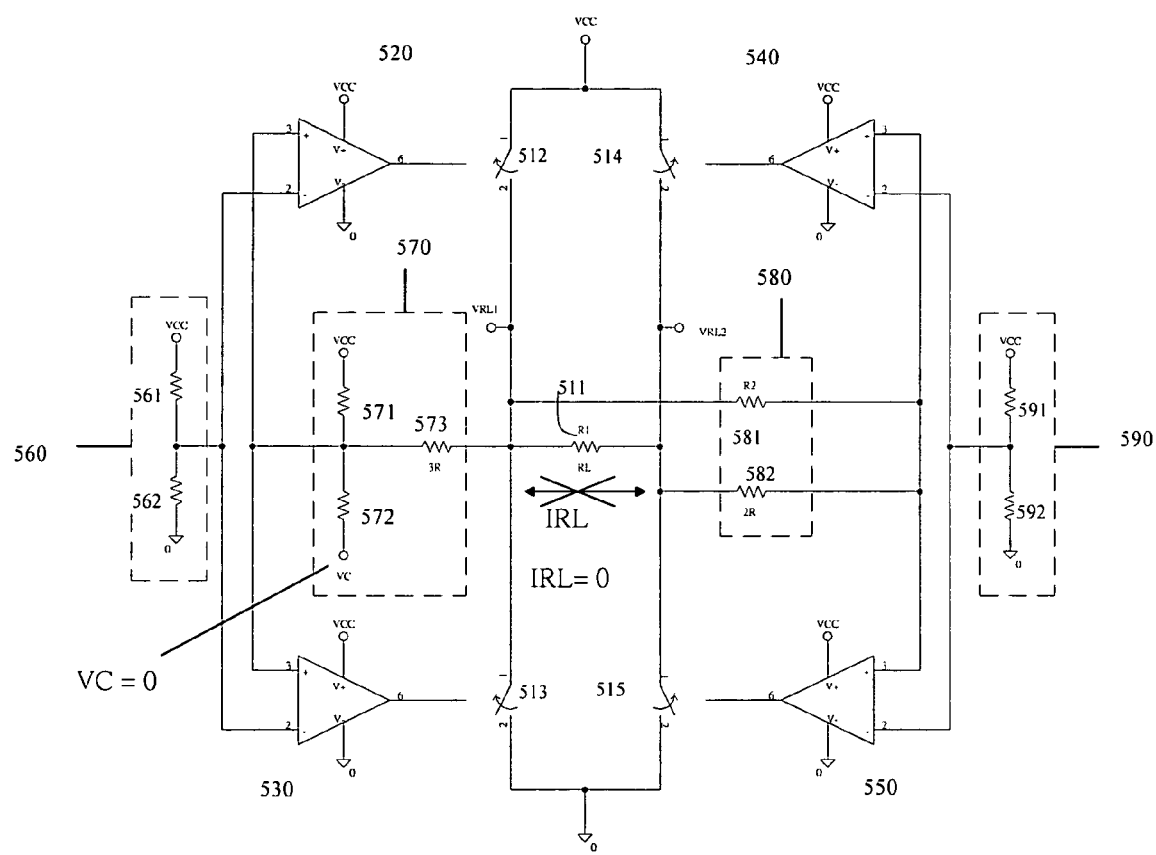
FIG. 10 is the working status diagram of the main H-bridge structure of FIG. 5 when the control voltage Vc=0.

When the control voltage Vc=0 as shown in FIG. 10, because the outputs of the BJT power controllers 520, 530, 540, 550 are all at saturation, the VGS of four MOSFETs are all approximately 0.2V, i.e. $V_{GS}<V_T$, which turns off the MOSFETs 512, 513, 514, 515, and the load current becomes $I_{RL}=0$.

We now analyze the power consumption of the four MOSFETs. When the control voltage Vc<0, the MOSFET 513 and the MOSFET 514 are turned off without consuming any power, while current flowing through MOSFET 512 and MOSFET 515 $I_{512}=I_{515}=I_{RL}$, and the voltage drop from drain to source on MOSFET 512 is:

$$V_{DS1}=V_{cc}-V_{RL1}=V_{cc}-(V_{cc}/2-V_c)=V_{cc}/2+V_c \quad (6)$$

and the voltage drop from drain to source on MOSFET 515 is:

$$V_{DS4}=V_{RL2}=V_{cc}/2+V_c=V_{DS1} \quad (7)$$

Therefore, the power consumption for both of the MOSFET 512 and the MOSFET 515 are:

$$P_{512}=P_{515}=I_{512}V_{DS1}=I_{515}V_{DS4}=I_{RL}(V_{cc}/2+V_c) \quad (8).$$

When the control voltage $V_c>0$, the MOSFET 512 and the MOSFET 515 are turned off without consuming any power. Similarly, we can prove that the power consumptions for both MOSFET 513 and MOSFET 514 are all:

$$P_{513}=P_{514}=I_{513}V_{DS2}=I_{514}V_{DS3}=I_{RL}(V_{cc}/2-V_c) \quad (9).$$

Under the H-bridge arrangement, because the power consumption is evenly distributed on the two MOSFETs on a diagonal line, the damage to a certain transistor due to the concentration of the power consumption can be avoided.

Figure 11:
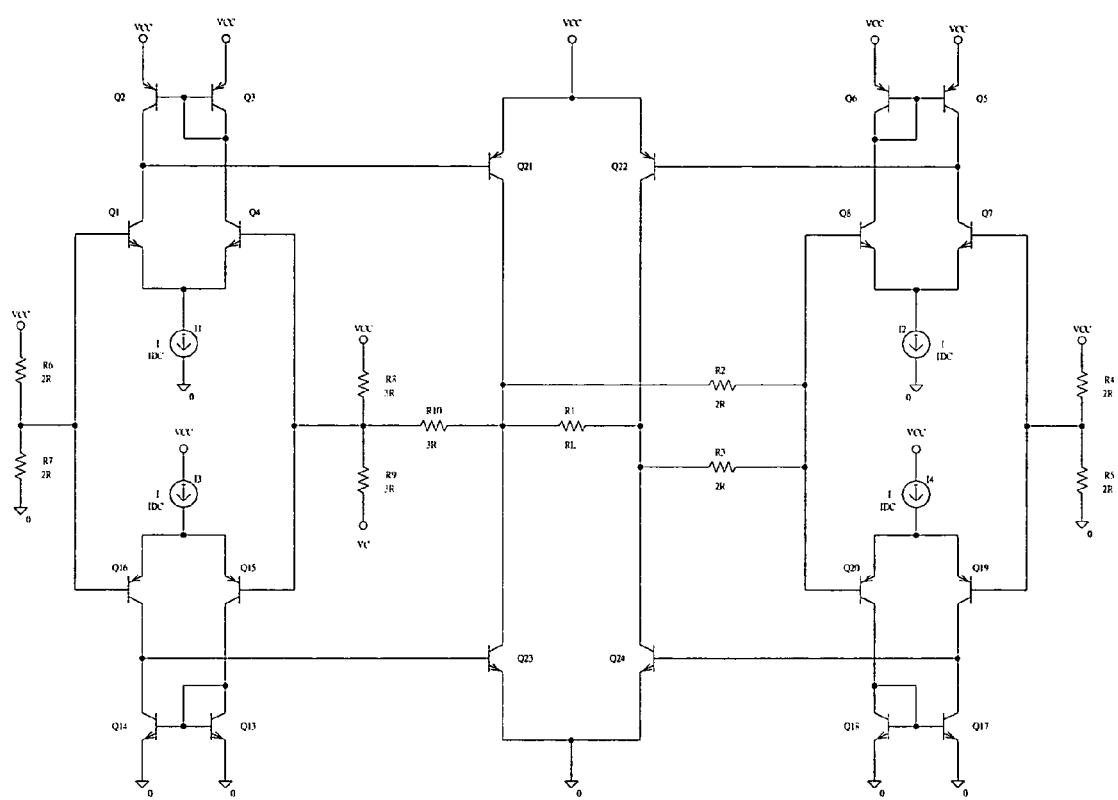
FIG. 11 is the circuit diagram of the bi-directionally load current driving circuit according to a second preferred embodiment of the present invention.
Figure 12:
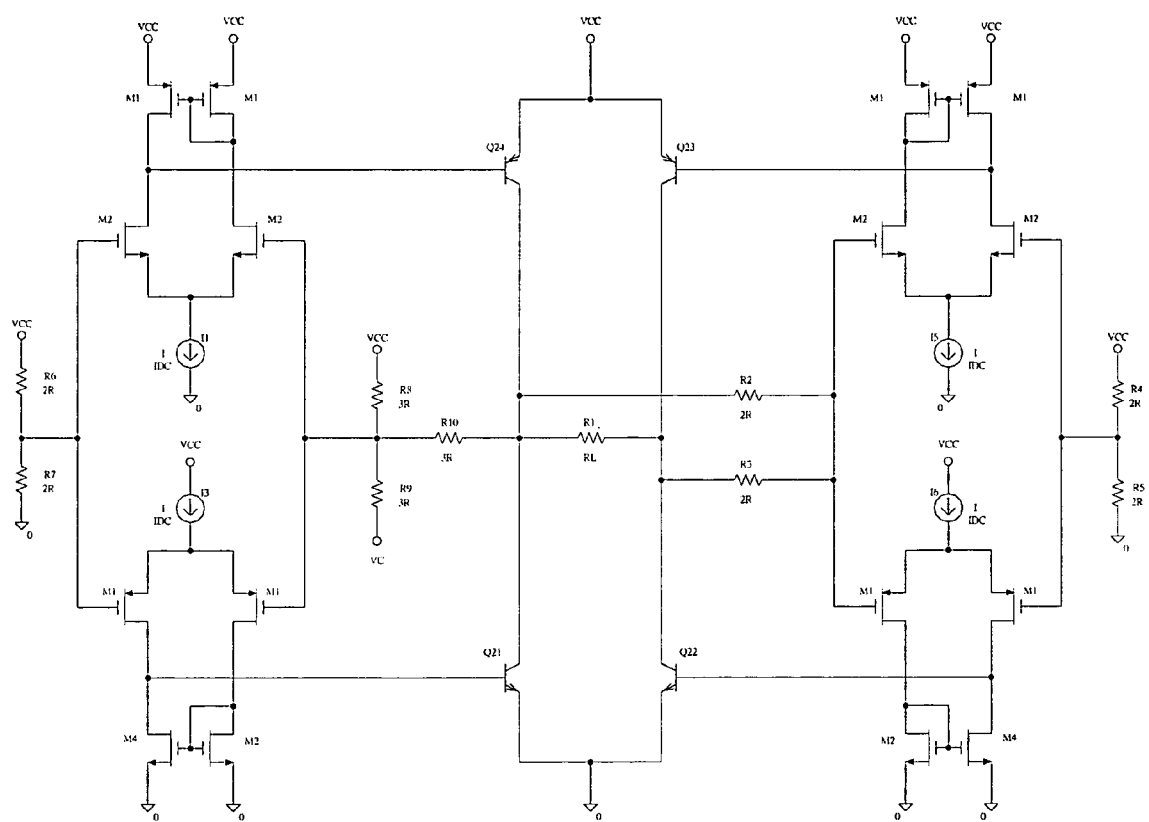
FIG. 12 is the circuit diagram of the bi-directionally load current driving circuit according to a third preferred embodiment of the present invention.
Figure 13:
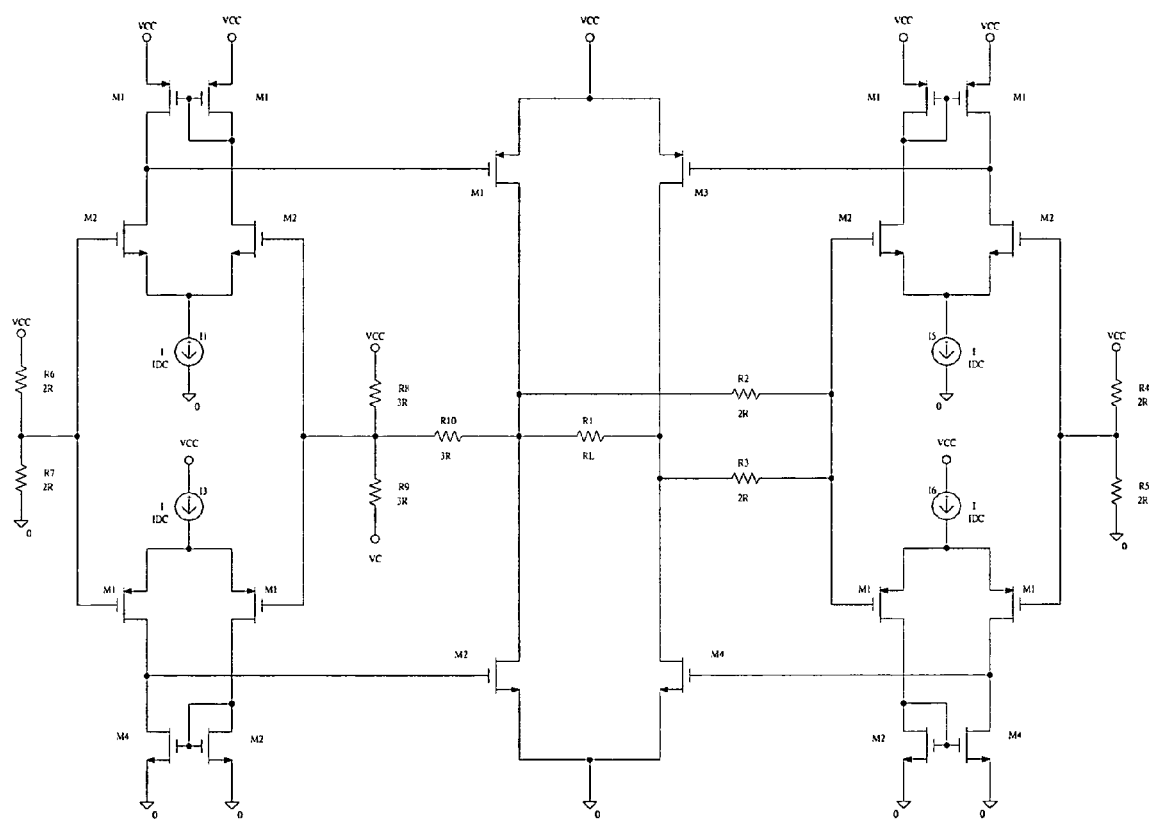
FIG. 13 is the circuit diagram of the bi-directionally load current driving circuit according to a fourth preferred embodiment of the present invention.

FIG. 5 shows the circuit diagram of the bi-directionally load current driving circuit according to a first preferred embodiment of the present invention. The H-bridge circuit comprises four MOSFETs, while the four power controllers are made of four BJTs. The invention can be modified to that all transistors are BJTs as shown on FIG. 11. Or the H-bridge circuit is made of all BJTs, while all four power controllers are MOSFETs as shown in FIG. 12. Or all transistors are MOSFETs as shown in FIG. 13 for an easy fabrication in an IC chip.

The invention usually employs a sensor to sense the load output of the H-bridge circuit, which will be converted to a voltage. After the voltage is compared with a preset voltage, a feedback voltage is produced by a feedback circuit, i.e. the Vc in the invention, which can be used to adjust the load current to the pre-determined value.

Figure 14:
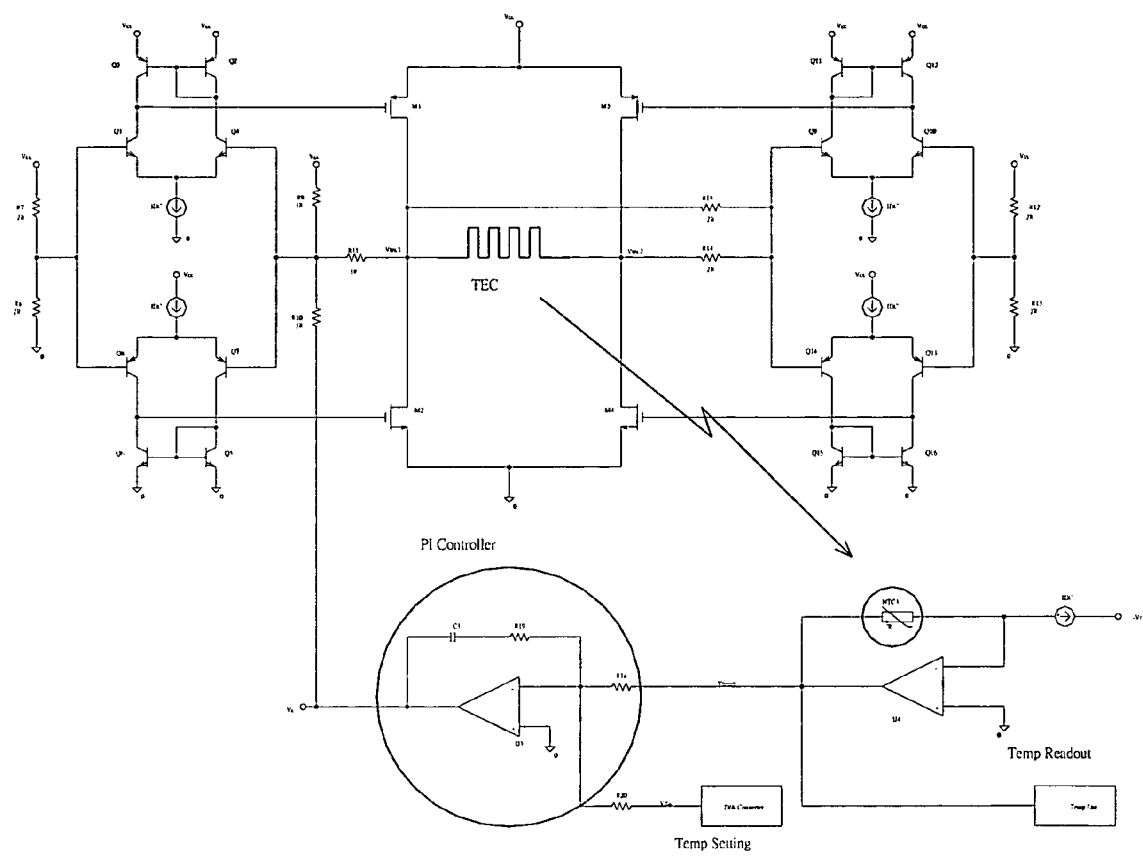
FIG. 14 is the circuit diagram for temperature control application on a thermal cooler element of the invention.
Figure 15:
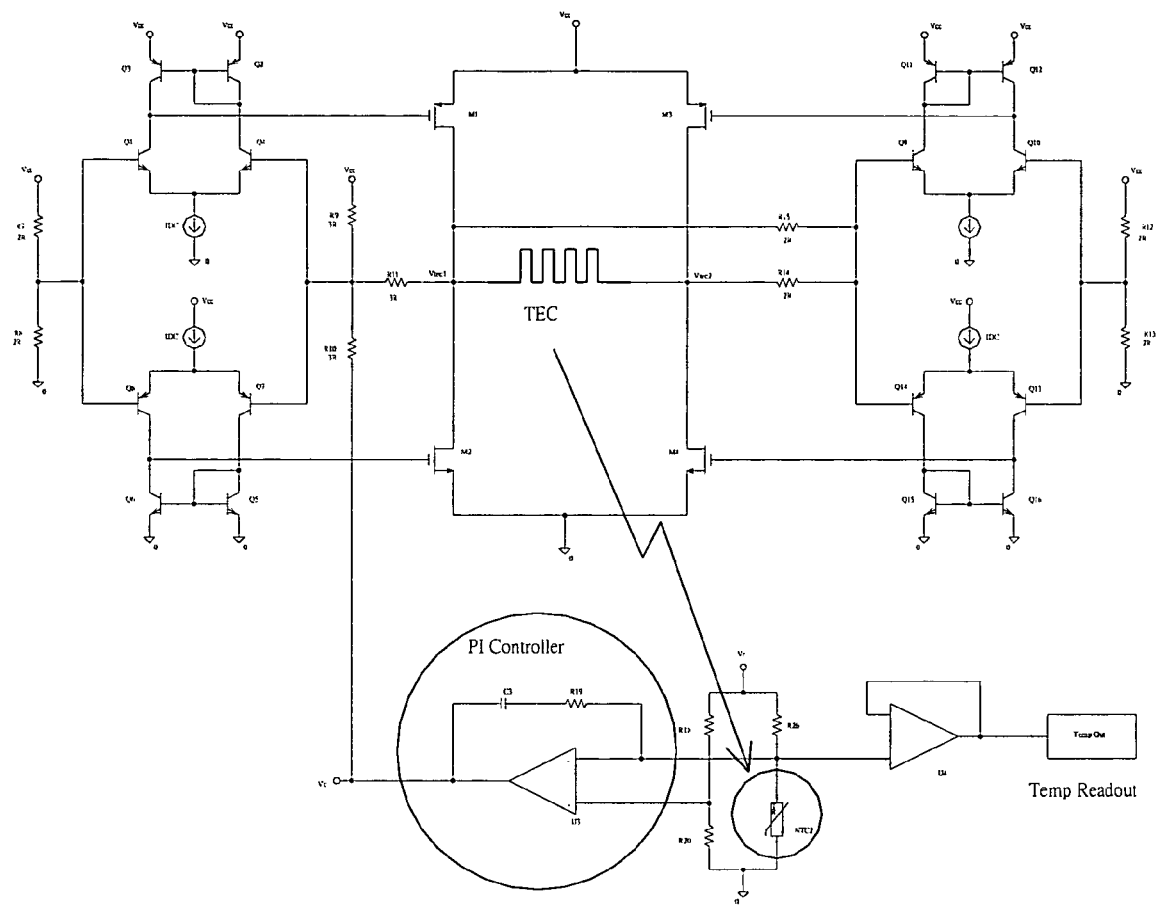
FIG. 15 is the circuit diagram for temperature control application on another thermal cooler element of the invention.

An embodiment for the temperature control of a traditional thermal electric cooler of the invention is explained and shown in FIG. 14 and FIG. 15, in which the load of the H-bridge circuit is the thermal electric cooler. Changing the direction of the current can raise or lower the temperature of the targeted object, i.e. a positive current will raise the temperature while a negative current will lower the temperature, and the value of current will affect the level of temperature change.

The sensor is a thermistor, whose characteristics will change with temperature. As shown in FIG. 14, a constant current source provides a fixed current through the resistor (which corresponds to a temperature) of thermistor to produce a voltage signal that can be used to adjust and control the system. As shown in FIG. 15, a bridge resistors structure is applied to convert the resistance of a thermistor into a voltage signal, which is then compared with other fixed resistors on the bridge to adjust and control the system. As shown in FIG. 14 and FIG. 15, if the sensed temperature is different from the preset value, the waveform of Vc will be adjusted by an integration circuit, and then a complete control circuit is formed.

One skilled in the art will understand that the embodiment of the present invention as shown in the drawings and described above is exemplary only and not intended to be limiting.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A bi-directionally load current driving circuit comprising:
   a voltage source;
   a bridge circuit comprising a first switch, a second switch, a third switch, and a fourth switch, wherein said voltage source provides a supply voltage to said first switch, said second switch, said third switch and said fourth switch, which are electrically connected to form two arms, said two arms has a first output terminal and a second output terminal individually, and said first output terminal and said second output terminal are connected to a load;
   a first differential amplifier comprising a first input terminal, a second input terminal, and an output terminal electrically connected to an input terminal of said first switch;
   a second differential amplifier comprising a first input terminal, a second input terminal, and an output terminal electrically connected to an input terminal of said second switch;
   a third differential amplifier comprising a first input terminal, a second input terminal, and an output terminal electrically connected to an input terminal of said third switch;

a fourth differential amplifier comprising a first input terminal, a second input terminal, and an output terminal electrically connected to an input terminal of said fourth switch;

a first feedback network connected to said first input terminal of said first differential amplifier and said first input terminal of said second differential amplifier;

a second feedback network comprising a control voltage connected to said second feedback network, which is connected to said second input terminal of said first differential amplifier, said second input terminal of said second differential amplifier, and said first output terminal of said bridge circuit;

a third feedback network connected to said first input terminal of said third differential amplifier, said first input terminal of said fourth differential amplifier, and said first output terminal and said second output terminal of said bridge circuit; and a fourth feedback network connected to said second input terminal of said third differential amplifier and said second input terminal of said fourth differential amplifier;

wherein a current flowing through the load is unrelated to said supply voltage;

instead, said current is proportional to said control voltage.

2. The bi-directionally load current driving circuit, as recited in claim 1, further comprising:

a current sensor and over-current protection circuit electrically connected to said bridge circuit for feeding back a voltage signal so as to provide a control signal when said current is over a predetermined value; and a power delay switch electrically connected to said current sensor and over-current protection circuit to turn off said power source to supply energy to said bi-directionally load current driving circuit when power delay switch receives said control signal.

3. The bi-directionally load current driving circuit, as recited in claim 1, wherein said bridge circuit is made of MOSFETs.

4. The bi-directionally load current driving circuit, as recited in claim 1, wherein said first differential amplifier, said second differential amplifier, said third differential amplifier, and said fourth differential amplifier are made of BJTs.

5. The bi-directionally load current driving circuit, as recited in claim 3, wherein said first differential amplifier, said second differential amplifier, said third differential amplifier, and said fourth differential amplifier are made of BJTs.

6. The bi-directionally load current driving circuit, as recited in claim 1, wherein said first differential amplifier, said second differential amplifier, said third differential amplifier, and said fourth differential amplifier are made of MOSFETs.

7. The bi-directionally load current driving circuit, as recited in claim 3, wherein said first differential amplifier, said second differential amplifier, said third differential amplifier, and said fourth differential amplifier are made of MOSFETs.

8. The bi-directionally load current driving circuit, as recited in claim 1, wherein said bridge circuit is made of BJTs.

9. The bi-directionally load current driving circuit, as recited in claim 8, wherein said first differential amplifier, said second differential amplifier, said third differential amplifier, and said fourth differential amplifier are made of BJTs.

10. The bi-directionally load current driving circuit, as recited in claim 8, wherein said first differential amplifier, said second differential amplifier, said third differential amplifier, and said fourth differential amplifier are made of MOSFETs.

11. The bi-directionally load current driving circuit, as recited in claim 1, wherein said first feedback network feeds back a half of said supply voltage to said first input terminal of said first differential amplifier and said first input terminal of said second differential amplifier.

12. The bi-directionally load current driving circuit, as recited in claim 1, wherein said second feedback network feeds back a third of said supply voltage, a third of said control voltage, and a third of an output voltage of said first output terminal of said bridge circuit to said second input terminal of said first differential amplifier and said second input terminal of said second differential amplifier.

13. The bi-directionally load current driving circuit, as recited in claim 11, wherein said second feedback network feeds back a third of said supply voltage, a third of said control voltage, and a third of an output voltage of said first output terminal of said bridge circuit to said second input terminal of said first differential amplifier and said second input terminal of said second differential amplifier.

14. The bi-directionally load current driving circuit, as recited in claim 1, wherein said third feedback network feeds back a half of output voltages of said first output terminal and said second output terminal of said bridge circuit to said first input terminal of said third differential amplifier and said first input terminal of said fourth differential amplifier.

15. The bi-directionally load current driving circuit, as recited in claim 13, wherein said third feedback network feeds back a half of output voltages of said first output terminal and said second output terminal of said bridge circuit to said first input terminal of said third differential amplifier and said first input terminal of said fourth differential amplifier.

16. The bi-directionally load current driving circuit, as recited in claim 1, wherein said fourth feedback network feeds back a half of said supply voltage to said second input terminal of said third differential amplifier and said second input terminal of said fourth differential amplifier.

17. The bi-directionally load current driving circuit, as recited in claim 15, wherein said fourth feedback network feeds back a half of said supply voltage to said second input terminal of said third differential amplifier and said second input terminal of said fourth differential amplifier.

18. A bi-directionally load current driving circuit comprising:

a voltage source;

a bridge circuit comprising a first switch, a second switch, a third switch, and a fourth switch, wherein said voltage source provides a supply voltage to said first switch, said second switch, said third switch and said fourth switch, which are electrically connected to form two arms, said two arms has a first output terminal and a second output terminal individually, and said first output terminal and said second output terminal are connected to a load;

a first power controller comprising a first input terminal, a second input terminal, and an output terminal electrically connected to an input terminal of said first switch;

a second power controller comprising a first input terminal, a second input terminal, and an output terminal electrically connected to an input terminal of said second switch;
a third power controller comprising a first input terminal, a second input terminal, and an output terminal electrically connected to an input terminal of said third switch;
a fourth power controller comprising a first input terminal, a second input terminal, and an output terminal electrically connected to an input terminal of said fourth switch;
a first feedback network connected to said first power controller and said second power controller;
a second feedback network comprising a control voltage connected to said second feedback network, which is connected to said first power controller, said second power controller, and said first output terminal of said bridge circuit;
a third feedback network connected to said third power controller, said fourth power controller, and said first output terminal and said second output terminal of said bridge circuit; and
a fourth feedback network connected to said third power controller and said fourth power controller;
wherein a current flowing through the load is unrelated to said supply voltage;
instead, said current is proportional to said control voltage.

19. The bi-directionally load current driving circuit, as recited in claim 18, wherein said first feedback network feeds back a half of said supply voltage to said first power controller and said second power controller.

20. The bi-directionally load current driving circuit, as recited in claim 18, wherein said second feedback network feeds back a third of said supply voltage, a third of said control voltage, and a third of an output voltage of said first output terminal of said bridge circuit to said first power controller and said second power controller.

21. The bi-directionally load current driving circuit, as recited in claim 19, wherein said second feedback network feeds back a third of said supply voltage, a third of said control voltage, and a third of an output voltage of said first output terminal of said bridge circuit to said first power controller and said second power controller.

22. The bi-directionally load current driving circuit, as recited in claim 18, wherein said third feedback network feeds back a half of output voltages of said first output terminal and said second output terminal of said bridge circuit to said third power controller and said fourth power controller.

23. The bi-directionally load current driving circuit, as recited in claim 21, wherein said third feedback network feeds back a half of output voltages of said first output terminal and said second output terminal of said bridge circuit to said third power controller and said fourth power controller.

24. The bi-directionally load current driving circuit, as recited in claim 18, wherein said fourth feedback network feeds back a half of said supply voltage to said third power controller and said fourth power controller.

25. The bi-directionally load current driving circuit, as recited in claim 23, wherein said fourth feedback network feeds back a half of said supply voltage to said third power controller and said fourth power controller.

26. A bi-directionally load current driving circuit comprising:

a voltage source;
a bridge circuit comprising a first switch, a second switch, a third switch, a fourth switch, a first output terminal, and a second output terminal, wherein said first output terminal and said second output terminal are connected to a load;
a first power controller comprising a first input terminal, a second input terminal, and an output terminal electrically connected to an input terminal of said first switch;
a second power controller comprising a first input terminal, a second input terminal, and an output terminal electrically connected to an input terminal of said second switch;
a third power controller comprising a first input terminal, a second input terminal, and an output terminal electrically connected to an input terminal of said third switch;
a fourth power controller comprising a first input terminal, a second input terminal, and an output terminal electrically connected to an input terminal of said fourth switch;
a plurality of feedback networks comprising a control voltage in which said plurality of feedback networks connected to said first power controller, said second power controller, said third power controller, and said fourth power controller such that a current flowing through the load is proportional to said control voltage.

27. The bi-directionally load current driving circuit, as recited in claim 26, wherein said first feedback network feeds back a half of said supply voltage to said first power controller and said second power controller.

28. The bi-directionally load current driving circuit, as recited in claim 26, wherein said second feedback network feeds back a third of said supply voltage, a third of said control voltage, and a third of an output voltage of said first output terminal of said bridge circuit to said first power controller and said second power controller.

29. The bi-directionally load current driving circuit, as recited in claim 27, wherein said second feedback network feeds back a third of said supply voltage, a third of said control voltage, and a third of an output voltage of said first output terminal of said bridge circuit to said first power controller and said second power controller.

30. The bi-directionally load current driving circuit, as recited in claim 26, wherein said third feedback network feeds back a half of output voltages of said first output terminal and said second output terminal of said bridge circuit to said third power controller and said fourth power controller.

31. The bi-directionally load current driving circuit, as recited in claim 29, wherein said third feedback network feeds back a half of output voltages of said first output terminal and said second output terminal of said bridge circuit to said third power controller and said fourth power controller.

32. The bi-directionally load current driving circuit, as recited in claim 26, wherein said fourth feedback network feeds back a half of said supply voltage to said third power controller and said fourth power controller.

33. The bi-directionally load current driving circuit, as recited in claim 31, wherein said fourth feedback network feeds back a half of said supply voltage to said third power controller and said fourth power controller.

* * * * *